United States Patent
Tao et al.

(10) Patent No.: US 10,523,110 B2
(45) Date of Patent: Dec. 31, 2019

(54) SYNCHRONOUS RECTIFIER CONTROLLER FOR OFFLINE POWER CONVERTER AND METHOD THEREFOR

(71) Applicant: SEMICONDUCTOR COMPONENTS INDUSTRIES, LLC, Phoenix, AZ (US)

(72) Inventors: Zhibo Tao, Palo Alto, CA (US); Lei Chen, Milpitas, CA (US); Kai-Fang Wei, Milipatas, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/974,084

(22) Filed: May 8, 2018

(65) Prior Publication Data
US 2019/0097521 A1    Mar. 28, 2019

Related U.S. Application Data

(60) Provisional application No. 62/564,605, filed on Sep. 28, 2017.

(51) Int. Cl.
| | |
|---|---|
| *H02M 3/335* | (2006.01) |
| *H02M 1/32* | (2007.01) |
| *H02M 1/08* | (2006.01) |
| *H02M 7/217* | (2006.01) |
| *H03K 5/24* | (2006.01) |

(52) U.S. Cl.
CPC .............. *H02M 1/32* (2013.01); *H02M 1/08* (2013.01); *H02M 7/217* (2013.01); *H02M 3/33523* (2013.01); *H03K 5/24* (2013.01)

(58) Field of Classification Search
CPC .......... H02M 1/32; H02M 7/217; H02M 1/08; H02M 3/33592; H02M 3/33576; H02M 3/33523; H02M 3/33553
USPC ............................... 363/21.06, 21.14, 50–53
See application file for complete search history.

(56) References Cited

U.S. PATENT DOCUMENTS

| | | | | |
|---|---|---|---|---|
| 5,006,736 | A * | 4/1991 | Davies | H03K 17/04123 327/428 |
| 6,459,595 | B2 * | 10/2002 | Assow | H02M 3/33561 363/21.14 |
| 6,563,724 | B2 | 5/2003 | Carsten | |
| 2016/0072399 | A1 * | 3/2016 | Kikuchi | H02M 3/33592 363/21.14 |

(Continued)

*Primary Examiner* — Alex Torres-Rivera
(74) *Attorney, Agent, or Firm* — Polansky & Associates, P.L.L.C.; Paul J. Polansky

(57) ABSTRACT

A synchronous rectifier (SR) controller includes a controller having an input adapted to be coupled to a drain of an SR transistor, and an output for providing a drive signal in response thereto, a gate driver having an input coupled to the output of the controller, and an output adapted to be coupled to a gate of the SR transistor for providing a gate signal thereto, a first transistor having a drain coupled to the gate terminal, a gate, and a source coupled to ground, and a protection circuit having an input coupled to the drain terminal, and an output coupled to the gate of the first transistor. The protection circuit is responsive to a voltage on the drain terminal exceeding a first voltage to provide a voltage on the gate of the first transistor greater than a turn-on voltage and less than an overvoltage of the first transistor.

20 Claims, 7 Drawing Sheets

(56) References Cited

U.S. PATENT DOCUMENTS

2017/0085188 A1 3/2017 Foresta et al.
2018/0076724 A1* 3/2018 Sugawara ............... H02M 1/32

* cited by examiner

SYNCHRONOUS RECTIFIER CONTROLLER FOR OFFLINE POWER CONVERTER AND METHOD THEREFOR

FIELD OF THE DISCLOSURE

The present disclosure relates generally to power conversion circuits, and more particularly to synchronous rectifier controllers for offline power converters.

BACKGROUND

Switched mode power supplies can be used to create a direct current (DC) voltage from an alternating current (AC) voltage by switching current through an energy storage element such as a transformer. The duty cycle of the switching is controlled to regulate the output voltage to a desired level. Flyback converters are a type of switched mode power supplies that are common in AC-to-DC voltage applications. A flyback converter is based on a flyback transformer that alternately builds up flux in the magnetic core and transfers energy to the output. When current is switched through the primary winding, the primary current in the transformer increases, storing energy within the transformer. When the switch is opened, the primary current in the transformer drops, inducing a voltage on the secondary winding. The secondary winding supplies current into the load. A controller varies the on- and off-times of a primary switch in series with the primary winding to regulate the output voltage to a desired level.

Flyback converters use a rectifier connected to the secondary winding to prevent the reverse flow of current through the secondary winding. The rectifier can take two forms. A passive rectifier, such as a diode, can be placed in series with the secondary winding to prevent reverse current flow. However the diode cannot properly prevent reverse current flow if the output power supply voltage exceeds the breakdown voltage of the diode. Moreover the diode causes a forward voltage drop when conductive, decreasing the efficiency of the converter. To solve these problems, another form of rectifier known as a synchronous rectifier is often used. A synchronous rectifier includes an active switch, usually an N-channel metal-oxide-semiconductor field effect transistor (MOSFET), connected in series with the secondary winding along with a controller that makes the transistor conductive at the appropriate time. Because the transistor can be biased fully on, synchronous rectifiers are generally more efficient than passive rectifiers.

However when the drain voltage of the synchronous rectifier (SR) transistor rises rapidly due to switching at power up, the gate voltage of the SR transistor could also rise quickly prior to the power up of the SR controller due to capacitive coupling between the drain and gate and between the gate and the source. At power up, the controller cannot keep the gate voltage low because it is not powered up yet. If the voltage on the gate of the SR transistor rises too much, it could cause the SR transistor to become conductive, creating undesirable shoot-through currents on the secondary side and causing potential damage to the system.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
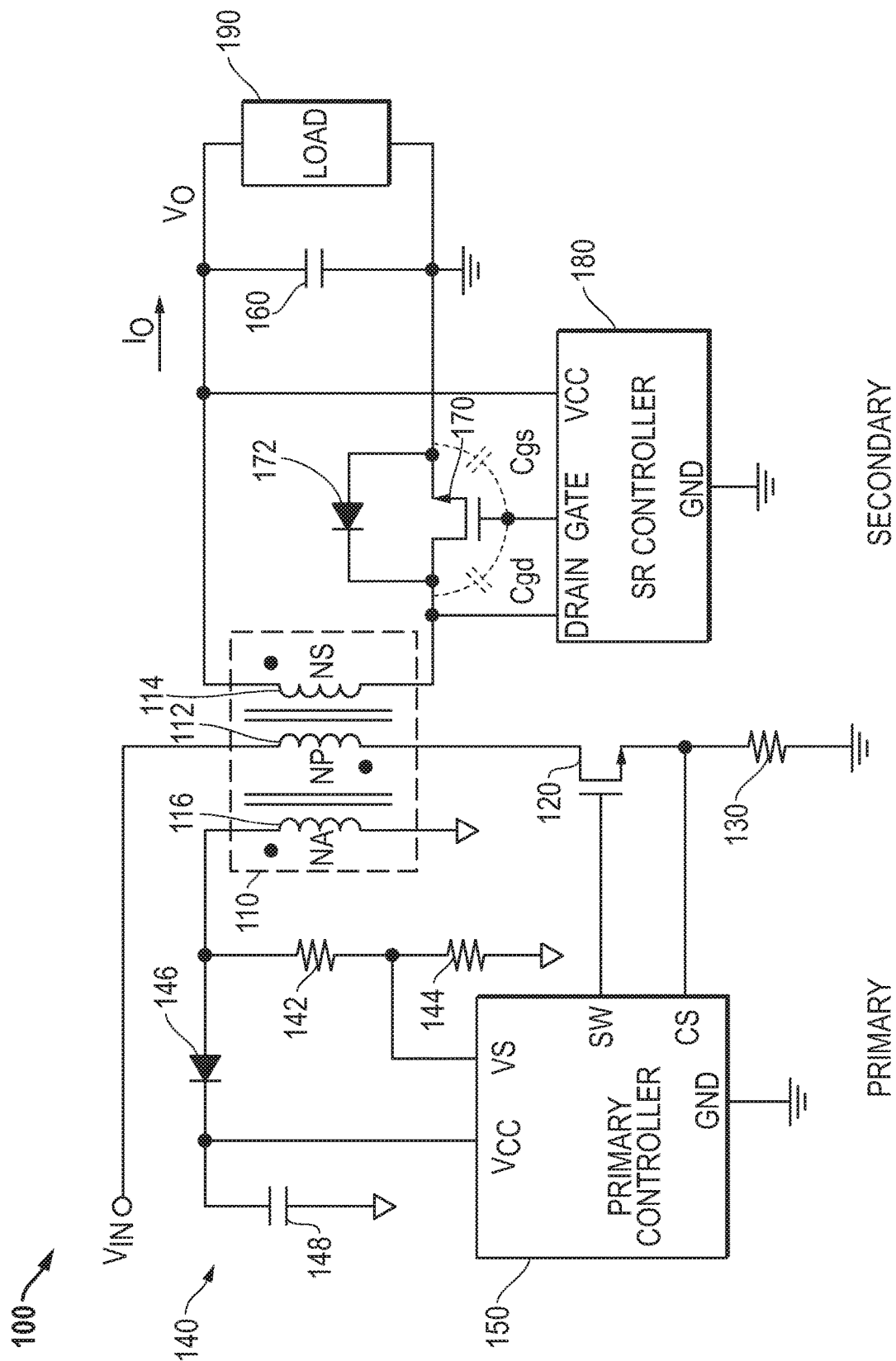
FIG. 1 illustrates in partial block diagram and partial schematic form an offline power converter with secondary side synchronous rectification.

FIG. 1 illustrates in partial block diagram and partial schematic form an offline power converter 100 with secondary side synchronous rectification. Offline power converter 100 includes generally a transformer 110, a power transistor 120, a sense resistor 130, an auxiliary circuit 140, a primary controller 150, an output capacitor 160, a synchronous rectifier (SR) transistor 170, a diode 172, an SR controller 180, and a load 190.

On the primary side, transformer 110 has a primary winding 112, a secondary winding 114, and an auxiliary winding 116. Primary winding 112 has a first end for receiving an input voltage labeled "$V_{IN}$", a second end, and a number of turns labeled "NP". Secondary winding 114 has a first end for providing an output voltage labeled "$V_O$", a second end, and a number of turns labeled "NS". Auxiliary winding 116 has a first end, a second end connected to primary ground, and a number of turns labeled "NA". Power transistor 120 is a high-power N-channel power metal-oxide-semiconductor field effect transistor (MOSFET) having a drain connected to the second end of primary winding 112, a gate, and a source. Sense resistor 130 has a first terminal connected to the source of power transistor 120, and a second terminal connected to primary ground. Auxiliary circuit 140 includes generally resistors 142 and 144, a diode 146, and a capacitor 148. Resistor 142 has a first terminal connected to the first end of auxiliary winding 116, and a second terminal. Resistor 144 has a first terminal connected to the second terminal of resistor 142, and a second terminal connected to primary ground. Diode 146 has an anode connected to the first end of auxiliary winding 116, and a cathode. Capacitor 148 has a first terminal connected to the cathode of diode 146, and a second terminal connected to primary ground. Primary controller 150 has a first power supply terminal labeled "$V_{CC}$" connected to the cathode of diode 146, a ground terminal labeled "GND" connected to primary ground, a first input terminal labeled "VS" connected to the second terminal of resistor 142, a second input terminal labeled "CS" connected to the first terminal of sense resistor 130, and an output terminal labeled "SW" connected to the gate of power transistor 120.

On the secondary side, output capacitor 160 has a first terminal connected to the first end of secondary winding 114, and a second end connected to secondary ground. SR transistor 170 is an N-channel power MOSFET having a drain connected to the second end of secondary winding 114, a gate, and a source connected to secondary ground. Diode 172 has an anode connected to the source of SR transistor 170, and a cathode connected to the drain of SR transistor 170. SR controller 180 has a power supply terminal similarly labeled "VCC" connected to the first end of secondary winding 114, a ground terminal similarly labeled "GND" connected to secondary ground, an input terminal labeled "DRAIN" connected to the drain of SR transistor 170, and an output terminal labeled "GATE" connected to the gate of SR transistor 170. Load 190 has a first terminal connected to the first end of secondary winding 114, and a second terminal connected to secondary ground.

In operation, offline power converter 100 uses transformer 110 in a flyback configuration to convert the input voltage $V_{IN}$ to a desired output voltage $V_O$. Sense resistor 130 also forms a voltage on its first terminal proportional to the amount of current flowing through power transistor 120 and provides this voltage to the CS input terminal of primary controller 150. Auxiliary circuit 140 reduces the voltage on the auxiliary winding 116 with a resistive divider formed by resistors 142 and 144 to provide sense voltage VS as a measure of the output voltage $V_O$. Auxiliary circuit 140 also rectifies and filters the voltage on the auxiliary winding 116 to form power supply voltage $V_{CC}$ for primary controller 150. Primary controller 150 varies the on time of power transistor 120 based on VS and CS using conventional pulse width modulation control techniques to regulate $V_O$ to a desired level.

On the secondary side, output capacitor 160 serves as an output capacitor that stores energy and smoothes the fluctuations in $V_O$. SR controller 180 controls the conduction of SR transistor 170 to make it non-conductive when the current is building in primary winding 112, and to make it fully conductive during the flyback period. Diode 172 allows current flow from secondary ground through secondary winding 114 to clamp the voltage at the second end of secondary winding 114 at one diode voltage drop below secondary ground.

After reset, primary controller 150 begins switching current through primary winding 112, but SR controller 180 is not operational until Vo rises sufficiently. However the voltage on the second end of secondary winding 114—and hence on the drain of SR transistor 170—rises quickly at switching events that begin before SR controller 180 is operational. This rapid switching boosts the voltage on the gate of SR transistor 170 through parasitic capacitances associated with SR transistor 170. One parasitic capacitance known as "Cgd" exists between the drain and the gate of SR transistor 170. Another parasitic capacitance known as "Cgs" exists between the gate and the source of SR transistor 170. At power up before SR controller 180 is able to drive the gate of SR transistor 170, the series combination of the Cgd and Cgs parasitic capacitances creates a voltage divider. If the voltage on the drain of SR transistor 170 spikes too high, the gate to source voltage induced by the spike is sufficient to make SR transistor 170 conductive, making SR transistor 170 fully conductive and causing damage to the circuit from shoot-through currents. If however the voltage spike on the gate terminal is smaller, it could still be high enough to bias SR transistor 170 in the sub-threshold range and cause it to be partially conductive.

Figure 2:
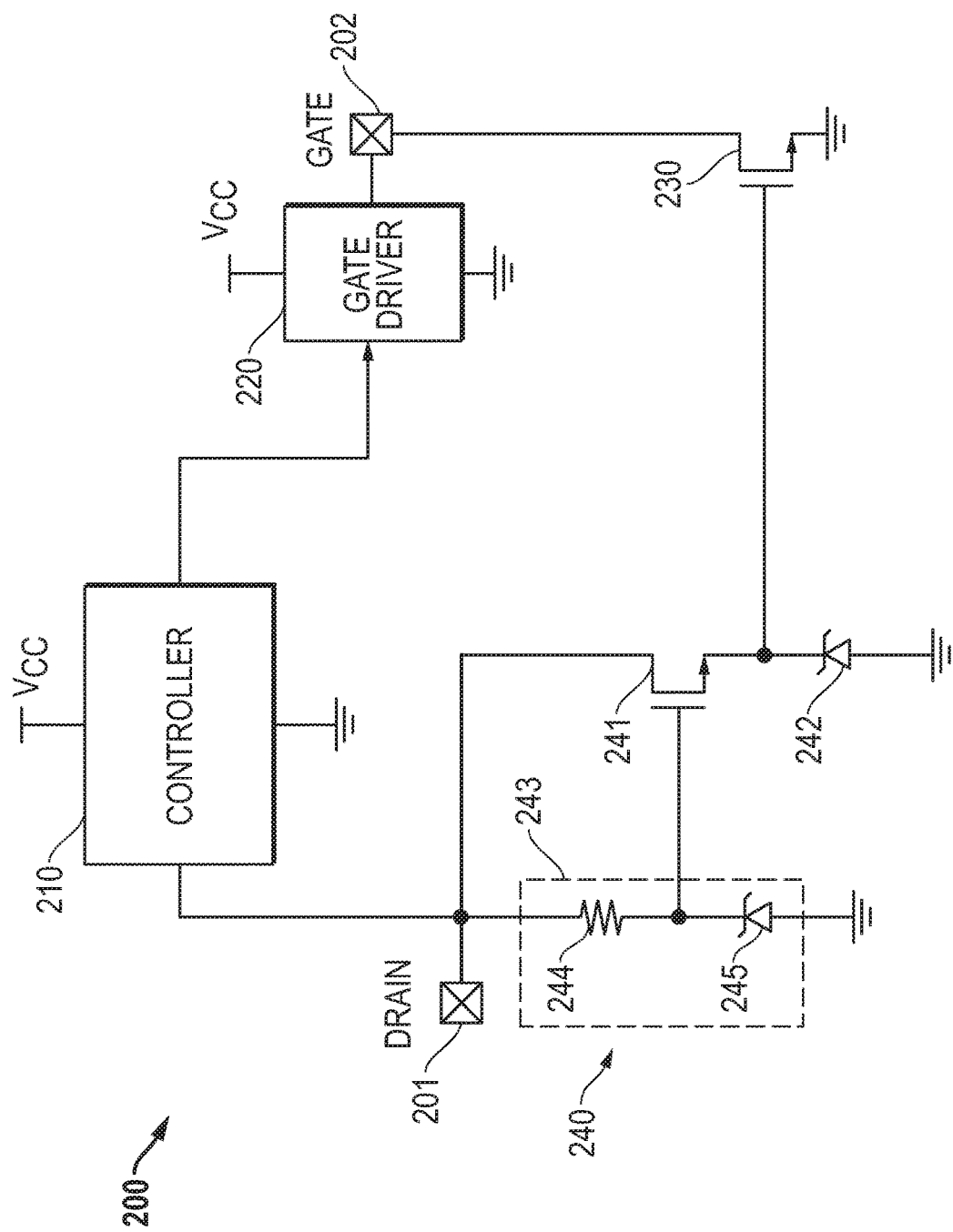
FIG. 2 illustrates in partial block diagram and partial schematic form a synchronous rectifier (SR) controller according to first embodiment of the synchronous rectifier controller of FIG. 1.

FIG. 2 illustrates in partial block diagram and partial schematic form an SR controller 200 according to first embodiment of SR controller 180 of FIG. 1. SR controller 200 includes a drain terminal 201 labeled "DRAIN", a gate terminal 202 labeled "GATE", a controller 210, a gate driver 220, a transistor 230, and a protection circuit 240. Controller 210 has a power supply terminal connected to $V_{CC}$, a ground terminal connected to secondary ground, an input terminal connected to drain terminal 201, and an output terminal for providing a drive signal. Gate driver 220 has a first power supply terminal connected to $V_{CC}$, a second power supply terminal connected to secondary ground, an input connected to the output of controller 210 for receiving the drive signal, and an output connected to gate terminal 202.

Protection circuit 240 includes a transistor 241, a zener diode 242, and a bias circuit 243. Transistor 241 is a high-voltage N-channel MOSFET having a drain connected to DRAIN terminal 201, a gate, and a source connected to the gate of transistor 230. Zener diode 242 has a cathode connected to the source of transistor 241, and an anode connected to secondary ground. Bias circuit 243 includes a resistor 244 and a zener diode 245. Resistor 244 has a first terminal connected to DRAIN terminal 201, and a second terminal connected to the gate of transistor 241. Zener diode 245 has a cathode connected to the second terminal of resistor 244, and an anode connected to secondary ground.

In operation, controller 210 provides the drive signal to the input of gate driver 220, which provides a corresponding signal on gate terminal 202. When SR controller 200 detects a high enough voltage on the DRAIN terminal, protection circuit 240 biases transistor 230 to be conductive. Transistor 241 operates as a source follower, in which the voltage on the source of transistor 241 follows the voltage on the gate thereof minus a threshold voltage. When the voltage on the gate of transistor 230 approaches an overvoltage level, zener diode 242 becomes conductive, effectively clamping the voltage on the gate of transistor 230 below a harmful voltage level. Moreover, zener diode 245 also becomes conductive, effectively clamping the voltage on the gate of transistor 241 below a harmful voltage level for it.

Transistors 230 and 241 are high-voltage transistors, capable of withstanding gate-to-source voltages above voltages that would rupture and damage the gates of conventional low-voltage transistors.

When the voltage at drain terminal 201 rises quickly, the voltage on the gate of transistor 241 is clamped by zener diode 245 at its breakdown voltage, which is selected to be higher than the threshold voltage of transistor 241. The breakdown voltage of zener diode 242 in turn is chosen to be higher than the threshold voltage of transistor 230. Zener diode 245 also protects the gate of transistor 241 and prevents it from going unsafely high when its drain voltage rises quickly, from the same parasitic capacitances discussed above. Once the voltage on DRAIN terminal 201 exceeds the breakdown voltage of zener diode 245, then transistors 241 and 230 are fully conductive to pull the gate voltage of SR transistor 170 safely to ground.

Thus protection circuit 240 is thus responsive to a voltage on DRAIN terminal 201 exceeding a first voltage to provide a voltage on the gate of transistor 230 that is greater than a turn-on voltage of transistor 230 but is less than an overvoltage of transistor 230. Protection circuit 240 is small and self-powered and prevents SR transistor 170 from turning on and even from becoming biased in its sub-threshold region during the power up of offline power converter 100. It is implemented with just a few components—two transistors, two zener diodes, and a resistor—but prevents harmful operation during power up.

Figure 3:
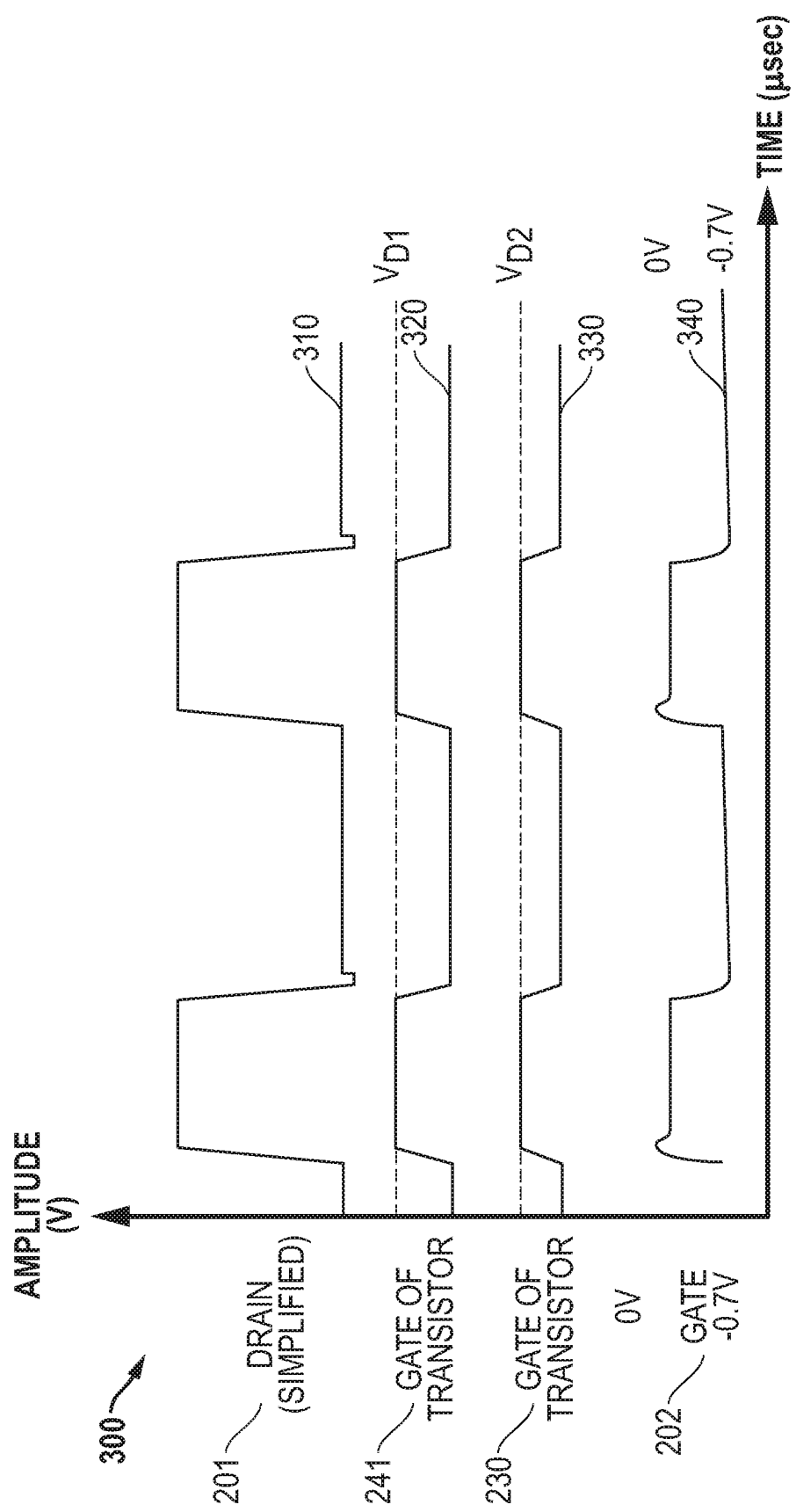
FIG. 3 illustrates a timing diagram useful in understanding the operation of the SR controller of FIG. 2.

FIG. 3 illustrates a timing diagram 300 useful in understanding the operation of the synchronous rectifier controller of FIG. 2. In timing diagram 300, the horizontal axis represents time in microseconds (μsec), and the vertical axis represents the amplitude of various signals in volts (V). Timing diagram 300 shows four waveforms of interest, including a waveform 310 representing the voltage of drain terminal 201, a waveform 320 representing the voltage on the gate of transistor 241, a waveform 330 representing the voltage on the gate of transistor 230, and a waveform 340 representing the voltage on gate terminal 202.

As shown in timing diagram 300, during a flyback cycle the voltage on drain terminal 201 rises, and the voltage on the gate of transistor 241 also rises until it is clamped at a clamp voltage labeled "$V_{D1}$". The voltage at the gate of transistor 230 follows the voltage on the gate of transistor 241 minus a threshold voltage of transistor 241. The voltage at the gate of transistor 230 is large enough to make transistor 230 fully conductive, and rises until it is clamped by zener diode 242 at a clamp voltage labeled "$V_{D2}$". Since transistor 230 is fully conductive, it pulls the voltage on the gate of SR transistor 170 to ground and keeps it nonconductive.

During a forward cycle following a flyback cycle, the voltage on drain terminal 201 falls quickly, which could make the voltage on the gate of SR transistor 170 fall below ground due to the parasitic capacitance coupling. The negative voltage on the gate of SR transistor 170—in this example about −0.7 volts, is clamped by transistor 230's main body diode and a parasitic capacitance between the source and gate.

Figure 4:
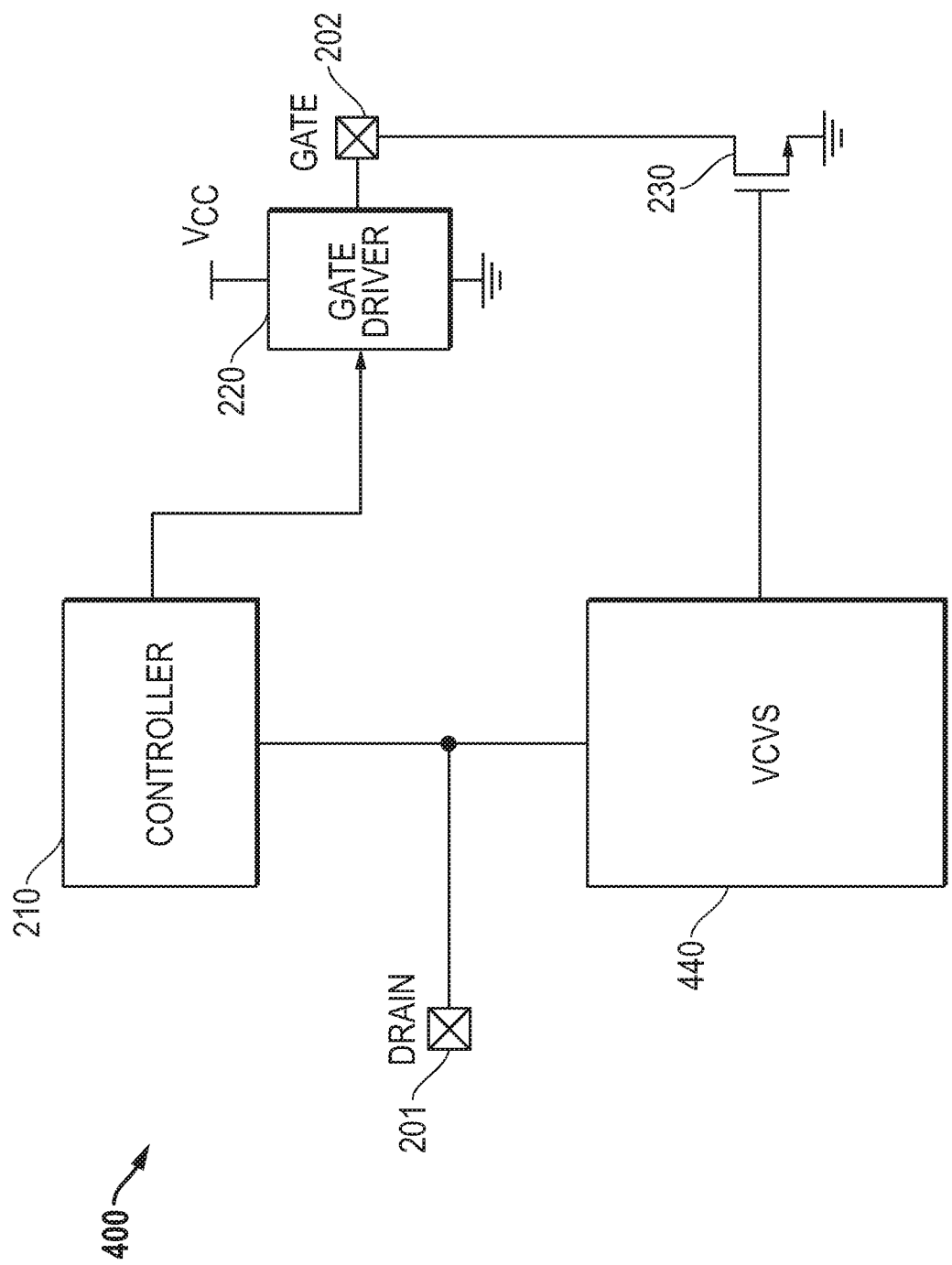
FIG. 4 illustrates in partial block diagram and partial schematic form an SR controller according to second embodiment of the synchronous rectifier controller of FIG. 1.

FIG. 4 illustrates in partial block diagram and partial schematic form an SR controller 400 according to second embodiment of SR controller 180 of FIG. 1. SR controller 400 includes drain terminal 201, gate terminal 202, controller 210, gate driver 220, and transistor 230 as previously illustrated in FIG. 2. SR controller 400, however, includes a protection circuit 440 instead of protection circuit 240 of FIG. 2. As shown in FIG. 4, protection circuit 440 is implemented as a voltage controlled voltage source ("VCVS") that drives the gate of transistor 230 with a voltage proportional to the voltage on the drain terminal 201. Protection circuit 440 is useful, for example, in systems that can be characterized well enough so that the transfer characteristic of the voltage controlled voltage source biases the gate of transistor 230 to a level that is greater than its turn-on voltage but less than its breakdown voltage.

Figure 5:
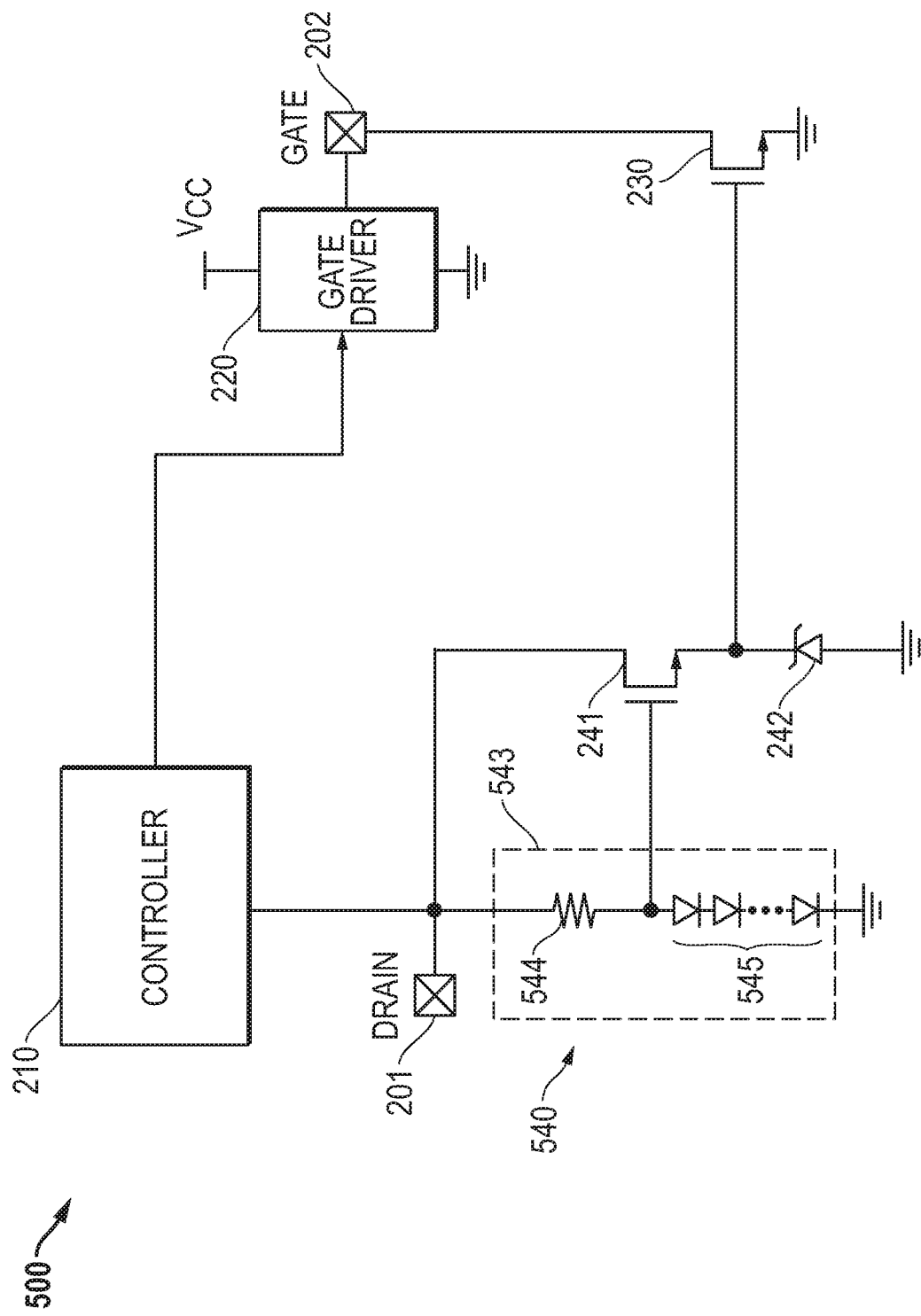
FIG. 5 illustrates in partial block diagram and partial schematic form an SR controller according to third embodiment of the synchronous rectifier controller of FIG. 1.

FIG. 5 illustrates in partial block diagram and partial schematic form an SR controller 500 according to third embodiment of SR controller 180 of FIG. 1. SR controller 500 includes drain terminal 201, gate terminal 202, controller 210, gate driver 220, and transistor 230 as previously illustrated in FIG. 2. SR controller 500, however, includes a protection circuit 540 instead of protection circuit 240 of FIG. 2. Protection circuit 540 includes transistor 241 and zener diode 242 as previously illustrated with respect to protection circuit 240 of FIG. 2, but a bias circuit 543 instead of bias circuit 243 of FIG. 2. Bias circuit 543 includes a resistor 544 and a series of diodes 545. Resistor 544 has a first terminal connected to drain terminal 201, and a second terminal connected to the gate of transistor 241. Diodes 545 include three representative diodes of a set of N diodes in which a first diode has an anode connected to the second terminal of resistor 544, and a cathode, a second diode has an anode connected to the cathode of the first diode, and so on until a last or "$N_{TH}$" diode has an anode connected to the cathode of the pervious diode in the series, and a cathode connected to secondary ground.

Instead of a zener diode as in SR controller 200 of FIG. 2, SR controller 500 uses a diode chain that becomes conductive, and hence clamps the voltage on the gate of transistor 241, based on the number of diodes times the diode forward cut-in voltage. If the forward bias cut-in voltage of the diodes is about 0.7 V, then the gate bias voltage on the gate of transistor 241 can be chosen to within an accuracy of about 0.7 V.

Figure 6:
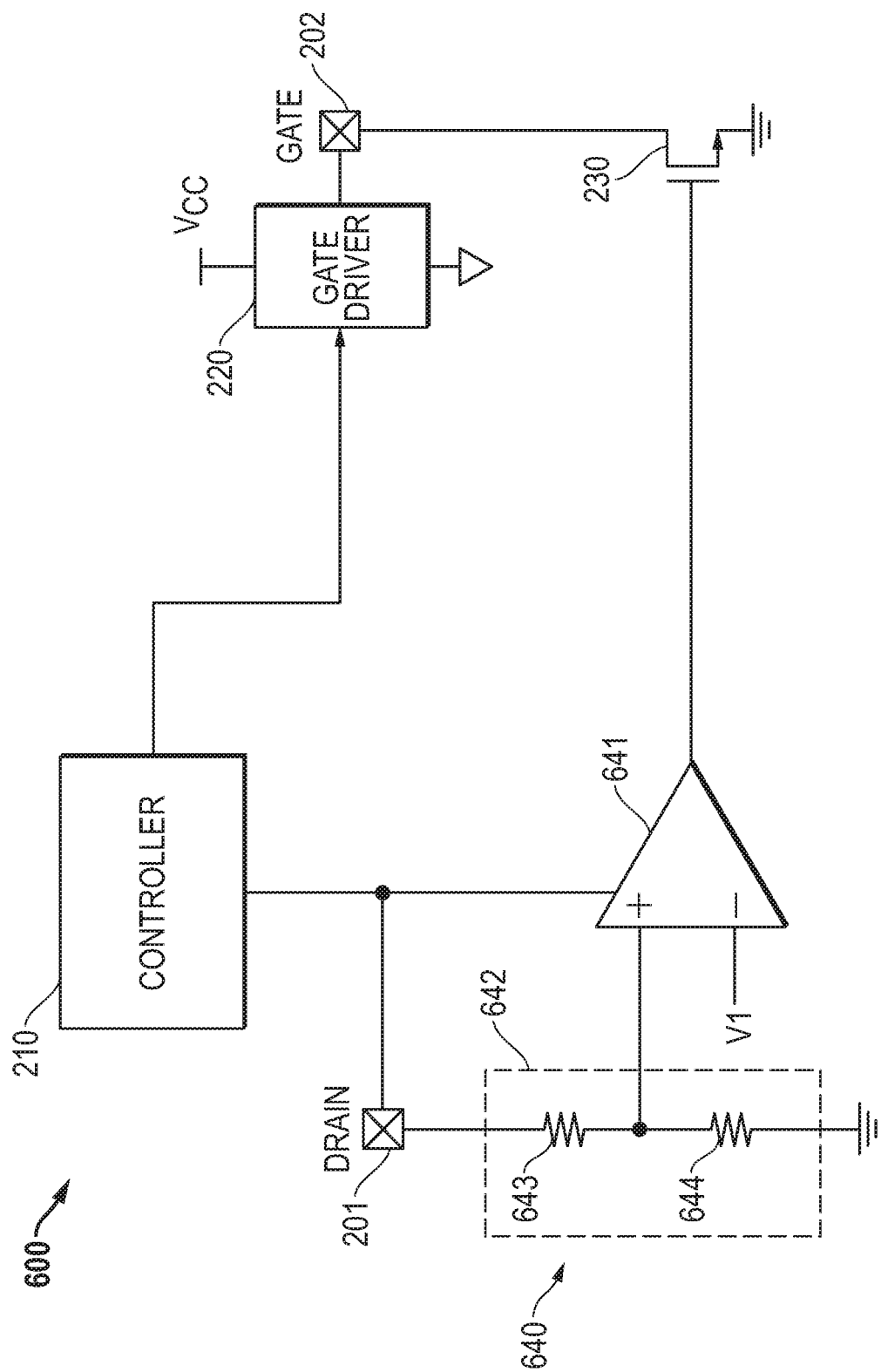
FIG. 6 illustrates in partial block diagram and partial schematic form an SR controller according to fourth embodiment of the synchronous rectifier controller of FIG. 1.

FIG. 6 illustrates in partial block diagram and partial schematic form an SR controller 600 according to fourth embodiment of SR controller 180 of FIG. 1. SR controller 600 includes drain terminal 201, gate terminal 202, controller 210, gate driver 220, and transistor 230 as previously illustrated in FIG. 2. SR controller 600, however, includes a protection circuit 640 instead of protection circuit 240 of FIG. 2. Protection circuit 640 includes a comparator 641 and a voltage divider 642. Comparator 641 has a power supply terminal connected to DRAIN terminal 201, a positive input terminal, a negative input terminal for receiving a voltage labeled "V1", and an output terminal connected to the gate of transistor 230. Voltage divider 642 includes resistors 643 and 644. Resistor 643 has a first terminal connected to drain terminal 201, and a second terminal connected to the positive terminal of comparator 641. Resistor 644 has a first terminal connected to the second terminal of resistor 643, and a second terminal connected to secondary ground.

Comparator 641 provides a voltage in a logic high state to the gate of transistor 230 when the voltage on drain terminal 201 divided by the divide ratio established by resistors 643 and 644 exceeds reference voltage V1. Comparator 641 sets the logic high level with reference to the voltage on drain terminal 201, and comparator 641 internally adjusts it to be greater than the turn-on voltage of transistor 230 but less than the overvoltage of transistor 230. Comparator 641 provides sharp on- and off-states and prevents transitioning through sub-threshold regions. By carefully matching resistors 643 and 644 and carefully setting reference voltage V1, SR controller 600 allows the voltage at which transistor 230 becomes conductive to be set with a high degree of precision.

Figure 7:
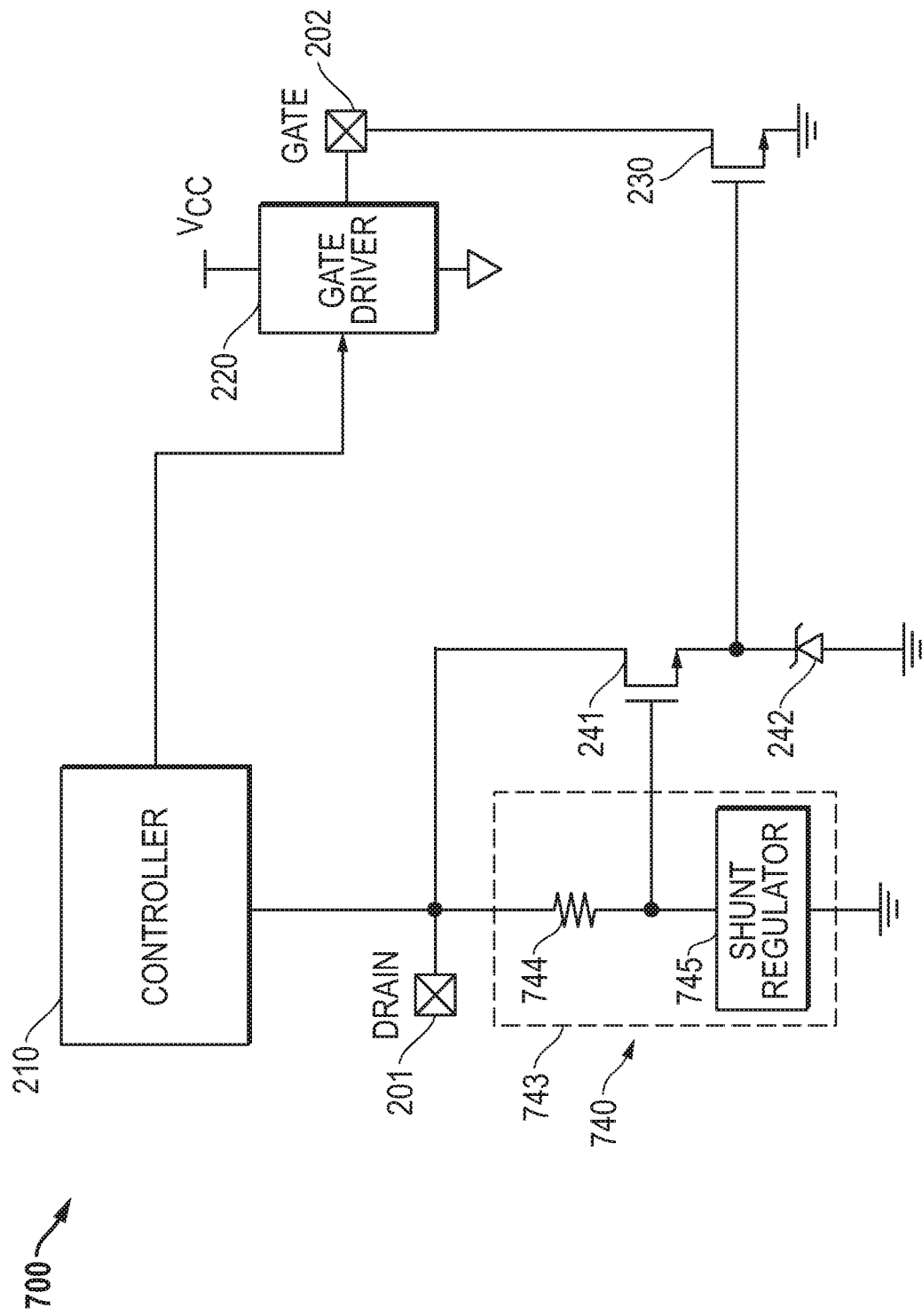
FIG. 7 illustrates in partial block diagram and partial schematic form an SR controller according to fifth embodiment of the synchronous rectifier controller of FIG. 1.

FIG. 7 illustrates in partial block diagram and partial schematic form an SR controller 700 according to fifth embodiment of SR controller 180 of FIG. 1. SR controller 700 includes drain terminal 201, gate terminal 202, controller 210, gate driver 220, and transistor 230 as previously illustrated in FIG. 2. SR controller 700, however, includes a protection circuit 740 instead of protection circuit 240 of FIG. 2. Protection circuit 740 includes transistor 241 and zener diode 242 as previously illustrated, and a bias circuit 743. Bias circuit 743 includes a resistor 744 and a shunt regulator 745. Resistor 744 has a first terminal connected to drain terminal 201, and a second terminal connected to the gate of transistor 241. Shunt regulator 745 has a first terminal connected to the second terminal of resistor 744, and a second terminal connected to secondary ground.

Instead of zener diode 245 used by SR controller 200, SR controller 700 uses shunt regulator 745 to limit the gate voltage on the gate of transistor 241. Because the breakdown voltage of a zener diode may be relatively fixed, SR controller 700 provides greater flexibility in setting this voltage.

The above-disclosed subject matter is to be considered illustrative, and not restrictive, and the appended claims are intended to cover all such modifications, enhancements, and other embodiments that fall within the true scope of the claims. For example, five different synchronous rectifier controllers with different protection circuits were disclosed above. However other protection circuit that are responsive to a voltage on drain terminal 201 exceeding a first voltage to provide a voltage on the gate of the first transistor that is greater than a turn-on voltage of the first transistor and less than an overvoltage of the first transistor may be used as well. The embodiments disclosed the use of high-voltage MOSFETs that can assumes a variety of forms, such as double-diffused MOS (DMOS) transistors, laterally diffused MOS (LDMOS) transistors, and the like. Moreover the synchronous rectifier controller as disclosed herein may be used to control synchronous rectifier transistors in different power supply topologies, such as clamps in active clamp flyback circuits. Also the disclosed circuits for protection during power up can be used with controllers implementing a variety of control mechanisms.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A synchronous rectifier controller for controlling a synchronous rectifier transistor having a drain, a gate, and a source, comprising:
    a controller having an input adapted to be coupled to the drain of the synchronous rectifier transistor at a drain terminal, and an output for providing a drive signal in response thereto;
    a gate driver having an input coupled to said output of said controller, and an output adapted to be coupled to the gate of the synchronous rectifier transistor at a gate terminal for providing a gate signal thereto;
    a first transistor having a drain coupled to said gate terminal, a gate, and a source coupled to ground; and
    a protection circuit having an input coupled to said drain terminal, and an output coupled to said gate of said first transistor, wherein said protection circuit is responsive to a voltage on said drain terminal exceeding a first voltage to provide a voltage on said gate of said first transistor that is greater than a turn-on voltage of said first transistor and less than an overvoltage of said first transistor.

2. The synchronous rectifier controller of claim 1, wherein said controller is powered by a first power supply voltage, and said protection circuit is powered by a voltage on said drain terminal and ground but not by said first power supply voltage.

3. The synchronous rectifier controller of claim 1, wherein said protection circuit comprises:
    a second transistor having a drain coupled to said drain terminal, a gate, and a source coupled to said gate of said first transistor;
    a first zener diode having a cathode coupled to said source of said second transistor, and an anode coupled to ground; and
    a bias circuit having a first terminal coupled to said drain terminal, a second terminal coupled to said gate of said second transistor, and a third terminal coupled to ground, wherein said bias circuit biases said gate of said second transistor to a voltage greater than a breakdown voltage of said first zener diode plus a threshold voltage of said second transistor in response to said voltage on said drain terminal.

4. The synchronous rectifier controller of claim 3, wherein said bias circuit comprises:
    a resistor having a first terminal coupled to said drain terminal, and a second terminal coupled to said gate of said second transistor; and
    a second zener diode having a cathode coupled to said second terminal of said resistor, and an anode coupled to ground, wherein said second zener diode has a breakdown voltage greater than a breakdown voltage of said first zener diode.

5. The synchronous rectifier controller of claim 3, wherein said bias circuit comprises:
    a resistor having a first terminal coupled to said drain terminal, and a second terminal coupled to said gate of said second transistor; and
    a plurality of diodes coupled in series between said second terminal of said resistor and ground, a first one of said plurality of diodes having an anode coupled to said second terminal of said resistor, a last one of said plurality of diodes having a cathode coupled to ground, wherein said plurality of diodes have a combined cutin voltage greater than a breakdown voltage of said first zener diode.

6. The synchronous rectifier controller of claim 3, wherein said bias circuit comprises:
    a resistor having a first terminal coupled to said drain terminal, and a second terminal coupled to said gate of said second transistor; and
    a shunt regulator having a first terminal coupled to said second terminal of said resistor, and a second terminal coupled to ground.

7. The synchronous rectifier controller of claim 1, wherein said protection circuit comprises:
    a voltage controlled voltage source having an input coupled to said drain terminal, and an output coupled to said gate of said first transistor, wherein said voltage controlled voltage source biases said gate of said first transistor above a threshold voltage of said first transistor when a voltage of said drain terminal exceeds a predetermined voltage.

8. The synchronous rectifier controller of claim 1, wherein said protection circuit comprises:
    a comparator having a power supply terminal coupled to said drain terminal, a positive input, a negative input for receiving a reference voltage, and an output coupled to said gate of said first transistor; and
    a voltage divider having a first terminal coupled to said drain terminal, a second terminal coupled to said positive input of said comparator for providing a divided voltage thereto, and a second terminal coupled to ground.

9. An offline power converter comprising:
    a transformer having a primary winding having a first end for receiving an input voltage, and a second end, and a secondary winding having a first end for providing an output voltage, and a second end;
    a power transistor having a drain coupled to said second end of said primary winding, a gate, and a source coupled to a primary ground terminal;
    a primary controller having an input for receiving a feedback signal, and an output coupled to said gate of said power transistor;

a synchronous rectifier transistor having a drain coupled to said second end of said secondary winding, a gate, and a source coupled to a secondary ground terminal; and a synchronous rectifier controller having a power supply terminal coupled to said first end of said secondary winding for receiving a power supply voltage, a drain terminal coupled to said second end of said secondary winding, a ground terminal coupled to secondary ground terminal, and a gate terminal coupled to said gate of said synchronous rectifier transistor, wherein said synchronous rectifier controller includes circuitry that discharges a voltage on said gate of said synchronous rectifier transistor during power-up of the synchronous rectifier controller that is powered by a voltage on said drain terminal and said secondary ground terminal but not by said power supply voltage.

10. The offline power converter of claim 9 wherein said synchronous rectifier controller comprises:
   a controller having an input coupled to said drain terminal, and an output for providing a drive signal in response thereto;
   a gate driver having an input coupled to said output of said controller, and an output coupled to said gate terminal;
   a first transistor having a drain coupled to said gate terminal, a gate, and a source coupled to said secondary ground terminal; and
   a protection circuit having an input coupled to said drain terminal, and an output coupled to said gate of said first transistor, wherein said protection circuit is responsive to a voltage on said drain terminal exceeding a first voltage to provide a voltage on said gate of said first transistor that is greater than a turn-on voltage of said first transistor and less than an overvoltage of said first transistor.

11. The offline power converter of claim 10, wherein said controller is powered by a first power supply voltage, and said protection circuit is powered by a voltage on said drain terminal and said secondary ground terminal but not by said first power supply voltage.

12. The offline power converter of claim 10, wherein said protection circuit comprises:
   a second transistor having a drain coupled to said drain terminal, a gate, and a source coupled to said gate of said first transistor;
   a first zener diode having a cathode coupled to said source of said second transistor, and an anode coupled to ground; and
   a bias circuit having a first terminal coupled to said drain terminal, a second terminal coupled to said gate of said second transistor, and a third terminal coupled to ground, wherein said bias circuit biases said gate of said second transistor to a voltage greater than a breakdown voltage of said first zener diode plus a threshold voltage of said second transistor in response to said voltage on said drain terminal.

13. The offline power converter of claim 12, wherein said bias circuit comprises:
   a resistor having a first terminal coupled to said drain terminal, and a second terminal coupled to said gate of said second transistor; and
   a second zener diode having a cathode coupled to said second terminal of said resistor, and an anode coupled to ground, wherein said second zener diode has a breakdown voltage greater than a breakdown voltage of said first zener diode.

14. The offline power converter of claim 12, wherein said bias circuit comprises:
   a resistor having a first terminal coupled to said drain terminal, and a second terminal coupled to said gate of said second transistor; and
   a plurality of diodes coupled in series between said second terminal of said resistor and ground, a first one of said plurality of diodes having an anode coupled to said second terminal of said resistor, a last one of said plurality of diodes having a cathode coupled to ground, wherein said plurality of diodes have a combined cutin voltage greater than a breakdown voltage of said first zener diode.

15. The offline power converter of claim 12, wherein said bias circuit comprises:
   a resistor having a first terminal coupled to said drain terminal, and a second terminal coupled to said gate of said second transistor; and
   a shunt regulator having a first terminal coupled to said second terminal of said resistor, and a second terminal coupled to ground.

16. The offline power converter of claim 10, wherein said protection circuit comprises:
   a voltage controlled voltage source having an input coupled to said drain terminal, and an output coupled to said gate of said first transistor, wherein said voltage controlled voltage source biases said gate of said first transistor above a threshold voltage of said first transistor when a voltage of said drain terminal exceeds a predetermined voltage.

17. The offline power converter of claim 10, wherein said protection circuit comprises:
   a comparator having a power supply terminal coupled to said drain terminal, a positive input, a negative input for receiving a reference voltage, and an output coupled to said gate of said first transistor; and
   a voltage divider having a first terminal coupled to said drain terminal, a second terminal coupled to said positive input of said comparator for providing a divided voltage thereto, and a second terminal coupled to ground.

18. A method for use in an offline power converter having a synchronous rectifier transistor with a drain coupled to a secondary winding of a transformer, comprising:
   detecting whether a voltage at the drain of the synchronous rectifier transistor exceeds a first voltage; and
   in response to detecting that said voltage at the drain of the synchronous rectifier transistor exceeds said first voltage, biasing a first transistor having a drain coupled to a gate of the synchronous rectifier transistor and a source coupled to ground to be conductive, wherein said biasing comprises:
      providing a voltage to a gate of said first transistor that is greater than a turn-on voltage of said first transistor and less than an overvoltage of said first transistor using a protection circuit powered only by a voltage on the drain of said synchronous rectifier transistor and ground.

19. The method of claim 18, wherein said providing said voltage to said gate of said first transistor that is greater than said turn-on voltage of said first transistor and less than said overvoltage of said first transistor comprises:
   clamping said voltage on said gate of said first transistor to a first clamped voltage.

20. The method of claim 19, wherein said providing said voltage to said gate of said first transistor comprises:

forming said voltage on said gate of said first transistor using a second transistor having a drain coupled to the drain of the synchronous rectifier transistor and a source coupled to said gate of said first transistor;

coupling a gate of said second transistor to the drain of the synchronous rectifier transistor through a resistor; and clamping said voltage on said gate of said second transistor to a second clamped voltage greater than said first clamped voltage by more than a threshold voltage of said second transistor.

* * * * *